United States Patent [19]
Sher

[11] Patent Number: 5,691,887
[45] Date of Patent: *Nov. 25, 1997

[54] SELF-TIMING POWER-UP CIRCUIT

[75] Inventor: Joseph C. Sher, Boise, Id.

[73] Assignee: Micron Technology, Inc., Boise, Id.

[*] Notice: The term of this patent shall not extend beyond the expiration date of Pat. No. 5,555,166.

[21] Appl. No.: 702,380

[22] Filed: Aug. 22, 1996

Related U.S. Application Data

[63] Continuation of Ser. No. 468,105, Jun. 6, 1995, Pat. No. 5,555,166.

[51] Int. Cl.$^6$ .............................. H02M 7/10; H03K 3/01
[52] U.S. Cl. .................................... 363/49; 327/544
[58] Field of Search ........................ 363/49; 323/282, 323/283, 284; 327/392, 393, 394, 535, 544, 545

[56] References Cited

U.S. PATENT DOCUMENTS

| | | | |
|---|---|---|---|
| H497 | 7/1988 | Piasecki | 307/594 |
| 4,948,995 | 8/1990 | Takahashi | 307/594 |
| 4,970,408 | 11/1990 | Hanke et al. | 307/272.3 |
| 4,983,857 | 1/1991 | Steele | 307/272.3 |
| 5,073,850 | 12/1991 | Pace | 363/49 |
| 5,172,012 | 12/1992 | Ueda | 307/272.3 |
| 5,204,558 | 4/1993 | Kumaki et al. | 327/544 |
| 5,243,231 | 9/1993 | Baik | 327/544 |
| 5,250,853 | 10/1993 | Bacigalupo | 327/394 |
| 5,323,067 | 6/1994 | Shay | 307/272.3 |
| 5,394,028 | 2/1995 | Feddeler et al. | 327/544 |
| 5,469,099 | 11/1995 | Konishi | 327/198 |
| 5,471,130 | 11/1995 | Agiman | 323/284 |
| 5,479,333 | 12/1995 | McCambridge et al. | 363/49 |

FOREIGN PATENT DOCUMENTS

| | | | |
|---|---|---|---|
| 0 333 405 | 9/1989 | European Pat. Off. | H03K 17/22 |
| 63-266921 | 4/1988 | Japan | H03K 17/22 |
| 6097796 | 8/1994 | Japan | H03K 17/22 |
| 2 059 707 | 4/1981 | United Kingdom | H03K 17/22 |

Primary Examiner—Matthew V. Nguyen
Attorney, Agent, or Firm—Seed and Berry LLP

[57] ABSTRACT

An improved power-up circuit formed in an integrated circuit for generating a power-up pulse for integrated circuit devices. The present invention includes an input stage, an output stage, and a pulse control circuit. The input stage receives a supply voltage rising from a reference ground to a steady supply voltage upon power-up. The input stage generates a logic low state for a selected period of time, and a logic high state thereafter. An output stage is connected to the input stage, and generates a logic high state when the input stage is generating the logic low state. The output stage switches to the logic low state when the input stage switches to the logic high state after the selected time period. The logic high and low states sequentially generated by the output stage define the power-up pulse. The pulse control circuit is connected between the input and output of the output stage for controlling the width of the power-up pulse. When the output of the output stage switches to the logic high state, the pulse control circuit prevents the output stage from switching to the logic low state for a selected delay period to ensure a minimum width for the generated power-up pulse. Hence, the power-up circuit consistently produces a proper power-up pulse regardless of the ramp-up rate of the supply voltage and power glitches associated with the supply voltage.

24 Claims, 3 Drawing Sheets

SELF-TIMING POWER-UP CIRCUIT

CROSS-REFERENCE TO RELATED APPLICATIONS

This application is a continuation of U.S. patent application Ser. No. 08/468,105, filed Jun. 6, 1995 U.S. Pat. No. 5,555,166.

TECHNICAL FIELD

This invention relates to integrated circuit devices, and more particularly, to a power-up circuit formed in the integrated circuit devices.

BACKGROUND OF THE INVENTION

Power-up circuits formed in an integrated circuit chip for providing a reset pulse to the same chip or other integrated circuit chips are well-known in the art. A power-up circuit generally includes a resistor and a capacitor connected in series to a supply voltage with the junction between the resistor and capacitor connected to the input of an inverter. When power is first applied to the power-up circuit, the capacitor starts to charge. While charging, the inverter outputs a logic high state. When the capacitor is sufficiently charged to produce a logic high state, the output of the inverter switches to a logic low state. The sequentially generated logic high and low states define a power-up pulse for driving the integrated circuit chips.

One disadvantage of the prior art power-up circuit is that when the supply voltage ramps up relatively slowly compared with the charging rate of the capacitor, the output of the capacitor tracks the supply voltage, and the output of the power-up circuit always stays at the logic low state. As a result, no pulse is produced, and power-up failure occurs. To ensure a proper power-up pulse over a wider range of the ramp-up rate of the supply voltage, larger capacitors have been used in power-up circuits. This, however, has created a problem under multiple power-up and power-down situations within a short period of time. Specifically, since the larger capacitor discharges very slowly, it may be only partially discharged. As a result, no power-up pulse is generated from the second power-up. Another disadvantage is that the prior art power-up circuit is highly susceptible to noise on the supply voltage. As is well-known in the art, the supply voltage level upon power-up is prone to power glitches as it rises from a reference ground to a steady supply voltage. These power glitches may cause no pulse or multiple pulses to be generated, both of which may result in a power-up failure.

It is therefore desirable to provide a power-up circuit that consistently produces a proper power-up pulse regardless of the ramp-up rate of, and power glitches on the supply voltage. It is also desirable to provide the power-up circuitry with a fast reset capability to provide the necessary power-up pulses under multiple power-up and power-down situations within a short period of time.

SUMMARY OF THE INVENTION

According to principles of the present invention, an improved power-up circuit is formed in an integrated circuit for generating a power-up pulse for integrated circuit devices. The present invention includes an input stage, an output stage, and a pulse control circuit. The input stage receives a supply voltage rising from a reference ground to a steady supply voltage upon power-up. The input stage generates a logic low state for a selected period of time, and a logic high state thereafter. An output stage is connected to the input stage, and generates a logic high state when the input stage is generating the logic low state. The output stage switches to the logic low state when the input stage switches to the logic high state after the selected time period. The logic high and low states sequentially generated by the output stage define the power-up pulse. The pulse control circuit is connected between the input and output of the output stage for controlling the width of the power-up pulse. When the output of the output stage switches to the logic high state, the pulse control circuit prevents the output stage from switching to the logic low state for a selected delay period to ensure a minimum width for the generated power-up pulse.

DETAILED DESCRIPTION OF THE INVENTION

Figure 1:
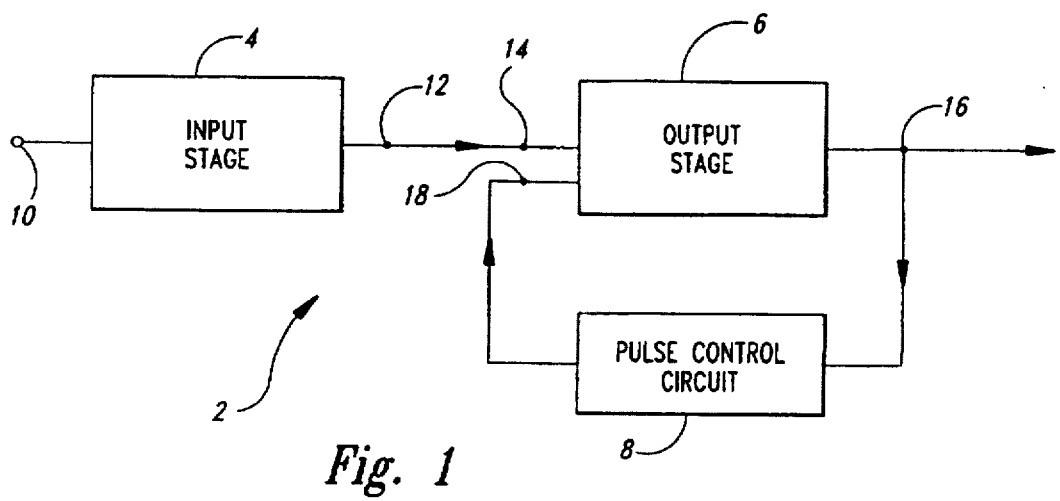
FIG. 1 is a block diagram of a power-up circuit according to the present invention.

FIG. 1 is a block diagram of a power-up circuit 2 according to the present invention. An input stage 4 receives at its input 10 a power supply voltage $V_{cc}$ which ramps up or rises from a reference ground to a steady supply voltage $V_{cc}$ upon a power-up. Based on the rise time of the supply voltage $V_{cc}$, the input stage 4 generates at its output 12 a logic low signal for a selected time period. After the selected time period, the output switches to a logic high state. The output 12 of the input stage 4 is connected to an input 14 of an output stage 6 which generates at its output 16 a logic signal opposite that received from the input stage 4. Thus, when the input stage 4 is generating a logic low state at its output 12, the output stage 6 generates a logic high state to create a leading edge of a power-up pulse. When the input stage 4 switches to the logic high state after the selected time period, the output stage 6 switches to the logic low state to create the trailing edge of the power-up pulse. The power-up circuit also includes a pulse control circuit 8 connected between another input 18 and the output 16 of the output stage 6 which controls the width of the power-up pulse. Once the output 16 of the output stage 6 is at the logic high state, the pulse control circuit 8 prevents the output 16 from switching to a logic low state for a selected delay period to ensure a minimum width of the power-up pulse required by the circuit device (not shown) being driven.

Figure 2:
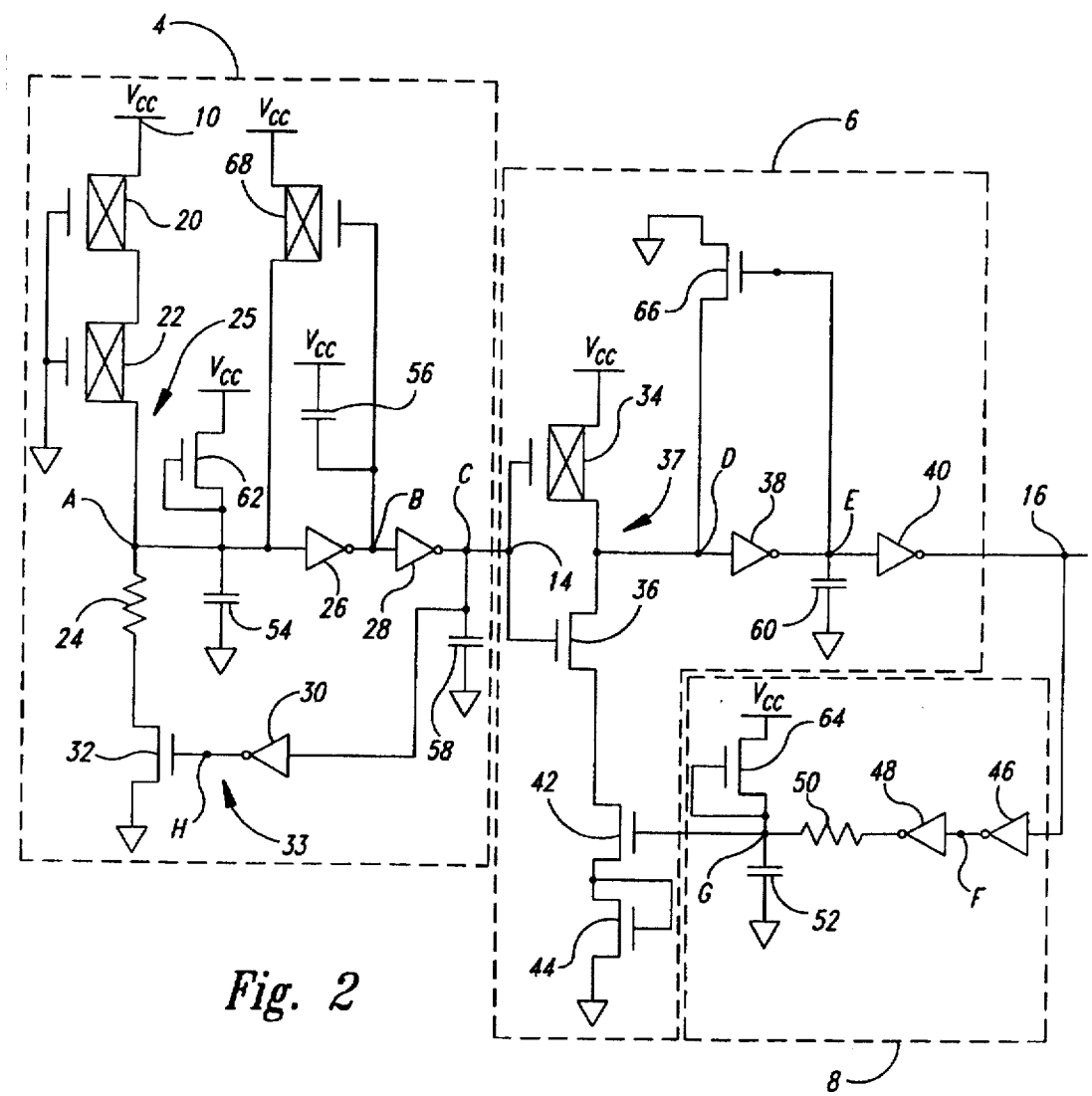
FIG. 2 is a detailed schematic diagram of a preferred embodiment of the circuit of FIG. 1.

FIG. 2 is a detailed schematic diagram of a preferred embodiment of the circuit of FIG. 1. The input stage 4 has an input 10 for receiving an external power supply voltage $V_{cc}$. A pair of PMOS transistors 20–22 are connected in series with each other. The transistors 20–22 are long channel devices so that they essentially act as resistors. The transistors 20–22 and a resistor 24 act as a voltage divider 25 which produces at node A a divided voltage that is a fraction of the supply voltage $V_{cc}$. A pair of inverters 26–28 act as delay elements for delaying the propagation of the logic state at node A. An inverter 30 and an NMOS transistor 32 comprise an isolating circuit 33 for electrically isolating the voltage divider 25 from the reference ground when node C is at logic high. As explained further below, the isolating circuit 33 minimizes a current chain through the voltage divider 25. Capacitors 54 and 58 are connected between the respective nodes A and C, and the reference ground to place nodes A and C at their proper initial states of 0 volts. A capacitor 56 connects node B to the supply voltage $V_{cc}$ to quickly pull up node B to a logic high as $V_{cc}$ rises.

In operation upon a power-up, the capacitor 54 charges through the transistors 20–22. When the voltage on the capacitor 54 reaches a logic high state, the output of the inverter 26 goes low, thereby turning on the transistor 68. The transistor 68 then latches the input to the inverter 26 at logic high to make the inverter 26 less sensitive to noise or power glitches. The logic low at the output of the inverter 26 then causes the output of the inverter 28 to go to logic high. A transistor 62 connected to node A operates as a diode, and provides a discharge path to the reference ground for the capacitor 54 when power is removed and $V_{cc}$ falls to 0 volts. The transistor 62 quickly resets the power-up circuit to provide a power-up pulse under multiple power-up and power-down situations. Thus, in operation, the output of the inverter 28 is initially at logic low at power-up, but a short time thereafter determined primarily by the rise time of the supply voltage $V_{cc}$, the capacitor 54, and the resistance of the transistors 20–22, the output of the inverter 28 goes to logic high. The logic high at the output of the inverter 28 after power-up is inverted by the inverter 30 to turn off the transistor 32. The transistor 32 then terminates the flow of current through the voltage divider 25. The isolating circuit 33 thus prevents power from being wasted in the voltage divider 25 after power-up.

The output stage 6 is connected to the output of the input stage 4. A PMOS transistor 34 and an NMOS transistor 36 are configured as an inverter. Inverters 38 and 40 act as delay elements for delaying the propagation of the logic state at node D. Since there are three inverters 37–40 between node C and the output 16, the output produces an opposite logic state from the logic state at node C of the input stage 4. When the supply voltage $V_{cc}$ initially rises from the reference ground, node C is at logic low which times on the transistor 34, and turns off the transistor 36. This results in a logic high at node D, and after a delay of two inverters 38 and 40, causes a logic high at the output 16 to create the leading edge of the power-up pulse. A capacitor 60 holds node E at its initial value of logic low. When the logic state at node C switches to a logic high after a selected time period, the transistor 34 turns off, and the transistor 36 turns on. The logic low state at node D causes node E to switch to a logic high state, and the output 16 to switch to a logic low state to create the trailing edge of the power-up pulse. As explained below with reference to the pulse control circuit 8, at the end of the power-up pulse, an NMOS transistor 42 is turned off. As a result, the logic high on node C cannot cause the transistor 36 to maintain node D at logic low. In order to prevent node D from floating after the power-up pulse has been produced, an NMOS transistor 66 connected between node D and the reference ground is turned on when node E goes high after the power-up pulse is generated and the output 16 is maintained at the logic low state.

The pulse control circuit 8 connects the output node 16 to a second input 18 of the output stage 6, and controls the width of the power-up pulse. The pulse control circuit 8 includes a pair of inverters 46–48, and an R-C network 50–52 which produces the time delay necessary to ensure a minimal pulse width. In an alternative embodiment, a counter may be used as the delay circuit instead of the R-C network 52—52. When the output 16 switches to logic high and creates the leading edge of the power-up pulse, the pulse control circuit 8 maintains that logic high state at the output 16 for a selected delay period regardless of the logic state at node C. More specifically, the power-up pulse cannot terminate with the output 16 going low until the logic high on node C is able to create a path to ground from node D through the transistors 36, 42 and 44. Thus, a logic high on node C cannot create a path from node D to the reference ground until the transistor 42 turns on. At the leading edge of the power-up pulse, the node G will be held at logic low through the capacitor 52. However, the power-up pulse at the output 16 will produce a logic high at the output of the inverter 48 that will charge the capacitor 52 through the resistor 50. When the capacitor 52 has been charged to a predetermined voltage, the transistor 42 will turn on. The time required for the transistor 42 to turn on is a function of the rise time of the external supply voltage $V_{cc}$, and the time constant of the resistor 50 and the capacitor 52 as well as the predetermined voltage 42 at which the transistor 42 turns on. An NMOS transistor 44 connected to the transistor 42 is configured as a diode to raise the predetermined voltage level required to turn on the transistor 42. Thus, for a given rise time of the external supply voltage $V_{cc}$, a predetermined time after the leading edge of the power-up pulse from the output 16, the transistor 42 turns on. If node C has already switched to logic high during the delay period as may be the case with a relatively slow rise time of the external supply voltage $V_{cc}$, transistor 36 turns on, and node D is pulled to the reference ground through the transistors 36, 42, and 44. Accordingly, the output 16 switches to logic low to create the trailing edge of the power-up pulse after the delay period. If node C is still at logic low after the delay period as may be the case with a relatively fast rise time for the external supply voltage $V_{cc}$, the output 16 switches to logic low when node C switches to logic high. Thus, the pulse control circuit 8 effectively locks the output 16 of the output stage 6 at logic high for the delay period to ensure a minimum width for the power-up pulse required by the circuit device (not shown) being driven.

As with the transistor 62, an NMOS transistor 64 is configured as a diode to bleed the charge stored in the capacitor 52 upon a power-down of the power-up circuit. The transistor 64 quickly resets the power-up circuit to provide the necessary pulse under multiple power-up and power down situations.

Figure 3:
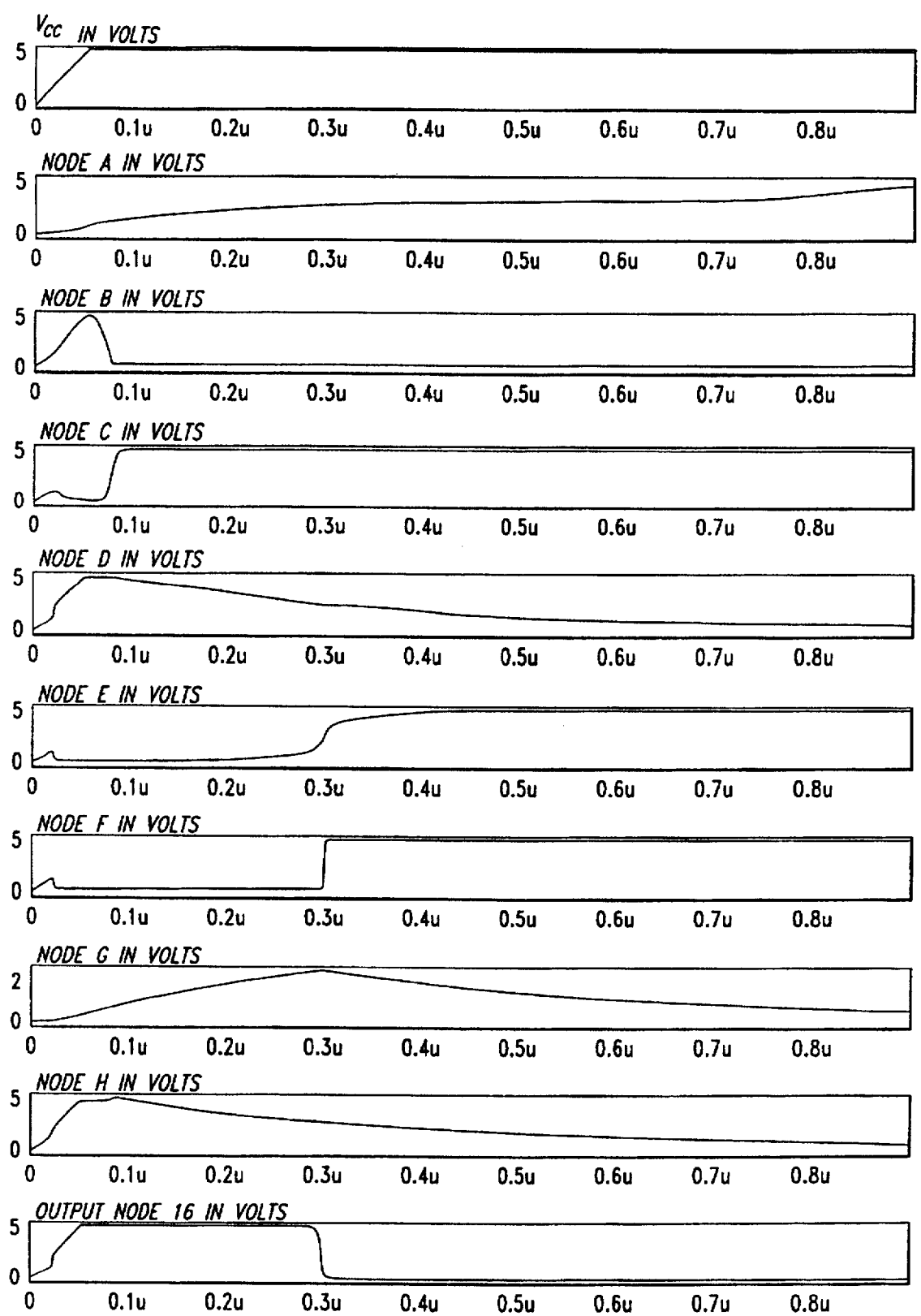
FIG. 3 is a graph of the voltage levels of various nodes on the circuit of FIG. 2 with a 50 nanosecond rise time of the supply voltage.

FIG. 3 is a graph of the voltage levels of various nodes on the circuit of FIG. 2 with a 50 nanosecond rise time of the supply voltage $V_{cc}$. Upon a power-up, the external power supply voltage $V_{cc}$ rises from zero volts to 5 volts in relatively fast 50 nanoseconds. Node A follows the supply voltage ramp at a slower rate. This causes node B to switch to logic high, and node C to logic low. At approximately 70 nanoseconds, the rising voltage level at node A switches node B to logic low, and node C to logic high. At approximately 25 nanoseconds, logic low at node C causes the output 16 to switch to logic high to produce the leading of the power-up pulse. After a delay of two inverters 46–48, the voltage level at node G starts to rise due to charging of the capacitor 52. While the capacitor 52 is charging, node C switches to logic high at approximately 80 nanoseconds. Due to the off state of the transistor 42, however, node D is prevented from switching to logic low. When the capacitor 52 is sufficiently charged after a selected delay period, it turns on the transistor 42 at approximately 290 nanoseconds. At that time, node D switches to logic low, and node E to logic high. This causes the output 16 to switch to logic low to produce the trailing edge of the power-up pulse.

Figure 4:
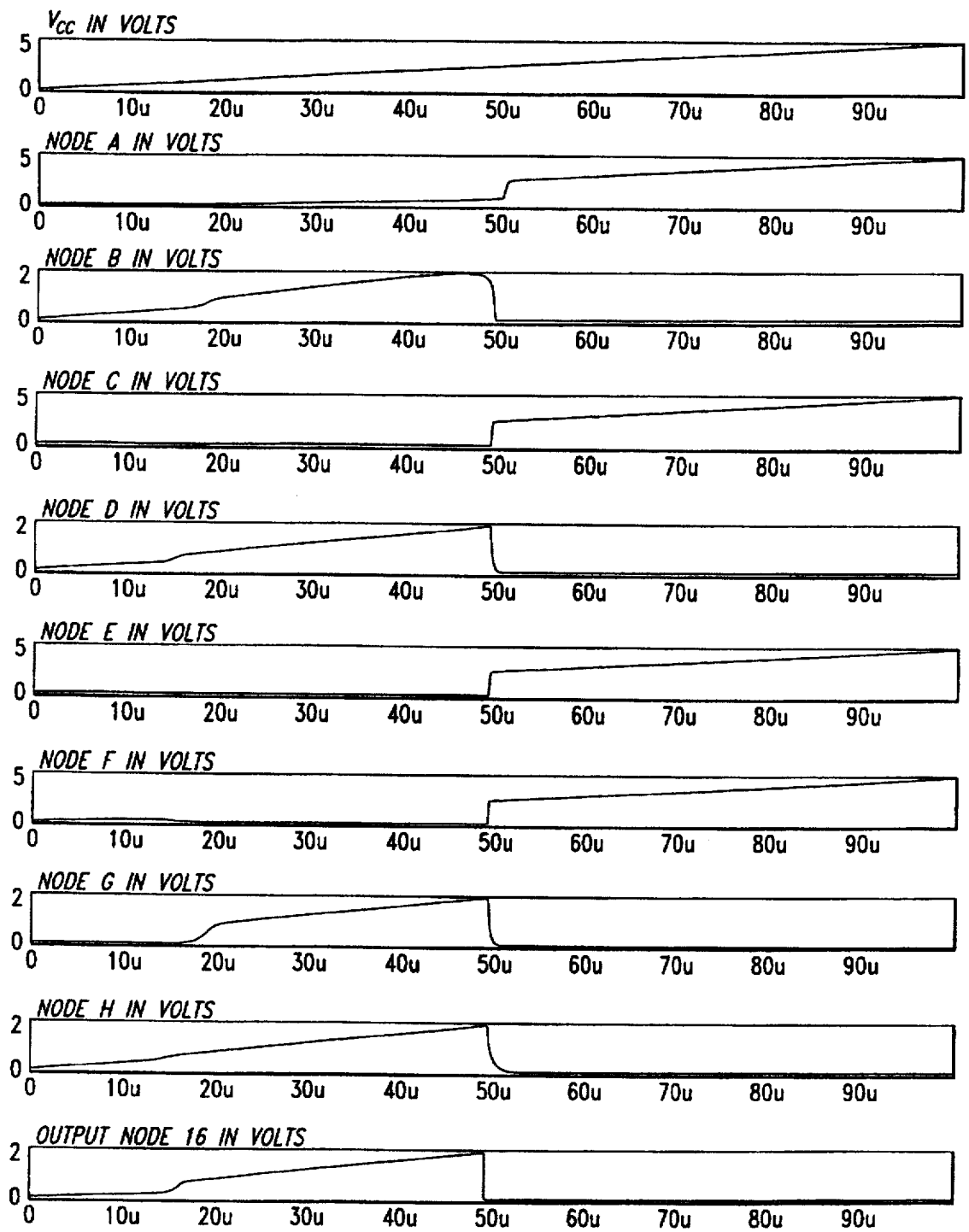
FIG. 4 is a graph of the voltage levels of various nodes on the circuit of FIG. 2 with a 100 microsecond rise time of the supply voltage.

FIG. 4 is a graph of the voltage levels of various nodes on the circuit of FIG. 2 with a 100 microsecond rise time of the supply voltage $V_{cc}$. Upon power-up, the external power supply voltage $V_{cc}$ rises from zero volts to 5 volts in relatively slow 100 microseconds. As in FIG. 3, node A follows the supply voltage ramp at a slower rate. This causes node B to switch to logic high, and node C to logic low. When node C is at logic low, node D is at logic high, and node E at logic low. At approximately 15 microseconds, the output 16 switches to logic high to produce the leading edge of the power-up pulse. After a delay of two inverters 46–48, the voltage level at node G stats to rise due to charging of the capacitor 52. When the capacitor 52 is sufficiently charged, it turns on the transistor 42 at approximately 40 microseconds. At that time, node C is still at logic low. At approximately 49 microseconds, the rising voltage level at node A switches node B to logic low, and node C to logic high. Once node C switches to logic high, node D switches to logic low, and node E to logic high. This causes the output 16 to switch to logic low to produce the trailing edge of the power-up pulse. The logic high state at node C also produces a logic low at node H through the inverter 30. This causes the transistor 32 to turn off and cuts off the voltage divider 25 from the reference ground to minimize a flow of current through the voltage divider 25.

As can be seen from FIGS. 1–4, a timing delay period is taken from the output 16 of the output stage 6 to control its own input to ensure that upon a power-up, the output 16 of the output stage 6 produces a logic high state of a predetermined minimum duration before producing a logic low state. Hence, the power-up circuit according to principles of the present invention consistently produces a proper power-up pulse regardless of the ramp-up rate of the supply voltage $V_{cc}$ and power glitches associated with the supply voltage. The power-up circuit may be easily modified to provide a power-up pulse of any desired height and width. The width of the power-up pulse may be adjusted by varying the value of the resistor 52 or the capacitor 52. The pulse height may be adjusted by either changing the threshold value of the transistor 44, or by varying the value of the transistor 20, the transistor 22, or the resistor 24.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

I claim:

1. A power-up circuit formed in an integrated circuit for generating a power-up pulse, comprising:

an output stage having a first input and being operable to generate at an output one logic state upon receipt of a supply voltage and another logic state when the first input is at a predetermined logic state, the one logic state and the another logic state sequentially generated by the output stage defining the power-up pulse; and a pulse control circuit connected between the first input and the output of the output stage, the pulse control circuit operable to generate and apply the predetermined logic state to the first input subsequent to a delay period after the generation of the one logic state by the output stage.

2. The power-up circuit according to claim 1 wherein the pulse control circuit comprises a counter for producing the delay period.

3. The power-up circuit according to claim 1 wherein the pulse control circuit comprises an R-C circuit for producing the delay period.

4. The power-up circuit according to claim 1 wherein the pulse control circuit comprises:

an R-C circuit for producing the delay period; and a bleeder circuit connected to the R-C circuit for discharging the charge stored in the R-C circuit upon a power-down of the power-up circuit.

5. The power-up circuit according to claim 1 wherein the output stage comprises a pair of serially connected inverters.

6. The power-up circuit according to claim 1 wherein the output stage comprises:

a pair of serially connected inverters; and a switch connected between the pair of inverters and the reference potential, the switch for isolating an input of the pair of inverters from the reference potential during the delay period and connecting the input of the pair of inverters to the reference potential when the predetermined logic state is generated.

7. The power-up circuit according to claim 1, further comprising:

an input stage having an input adapted to receive the supply voltage and an output connected to a second input of the output stage, the input stage operable to generate at its output a first logic state for a selected time period after receipt of the supply voltage and a second logic state thereafter;

wherein the output stage generates the one logic state when the second input is at the first logic state, and switches to the another logic state when the first input is at the predetermined logic state and the second input is at the second logic state, the logic states sequentially generated by the output stage defining the power-up pulse.

8. The power-up circuit according to claim 7 wherein the input stage comprises a voltage divider for providing the input stage with a divided supply voltage.

9. The power-up circuit according to claim 7 wherein the input stage comprises:

a voltage divider for providing the input stage with a divided supply voltage; and an isolating circuit for isolating the voltage divider from the reference potential to minimize a flow of current through the voltage divider when the output of the input stage is maintained at the second logic state.

10. The power-up circuit according to claim 9 wherein the isolating circuit isolates the voltage divider before the another logic state of the power-up pulse is generated.

11. The power-up circuit according to claim 7 wherein the input stage includes an isolating circuit for isolating the input stage from the reference potential to minimize a flow of current therethrough.

12. The power-up circuit according to claim 7 wherein the input stage comprises:

a voltage divider for providing the input stage with a divided supply voltage;

a first inverter adapted to receive the divided supply voltage; and a second inverter connected in series with the first inverter.

13. The power-up circuit according to claim 7 wherein the input stage comprises:

a voltage divider for providing the input stage with a divided supply voltage;

a first inverter adapted to receive the divided supply voltage;

a second inverter connected in series with the first inverter; and a latch circuit connected in parallel with the first inverter, the latch circuit for holding an output of the first inverter at the first logic state during a power glitch on the supply voltage.

14. The power-up circuit according to claim 7 wherein the input stage comprises:

a voltage divider for providing the input stage with a divided supply voltage;

a capacitor connected to the voltage divider;

a bleeder circuit connected to the voltage divider for discharging the charge stored in the capacitor upon a power-down of the power-up circuit.

15. A power-up circuit formed in an integrated circuit for generating a power-up pulse based on a supply voltage rising from a reference potential to a steady supply voltage, comprising:

an output stage having a first input and being operable to generate at its output a leading edge upon receipt of the supply voltage and a trailing edge when the first input is at a predetermined logic state, the leading edge and the trailing edge sequentially generated by the output stage defining the power-up pulse; and a pulse control circuit having an input connected to the output of the output stage and an output connected to the first input, the pulse control circuit operable to generate and apply the predetermined logic state to the first input after a delay period after the generation of the leading edge by the output stage to ensure a minimum width for the power-up pulse.

16. The power-up circuit according to claim 15, further comprising:

an input stage having an input adapted to receive the supply voltage and an output connected to a second input of the output stage, the input stage operable to generate at its output a first logic state for a selected time period after receipt of the supply voltage and a second logic state thereafter;

wherein the output stage generates the leading edge when the second input is at the first logic state, and generates the trailing edge when the first input is at the predetermined logic state and the second input is at the second logic state.

17. The power-up circuit according to claim 16 wherein the input stage comprises:

a voltage divider; and an isolating circuit for isolating the voltage divider from a reference ground to minimize a flow of current therethrough when the output of the input stage is maintained at the second logic state.

18. The power-up circuit according to claim 17 wherein the isolating circuit isolates the voltage divider before the trailing edge of the power-up pulse is generated.

19. The power-up circuit according to claim 16 wherein the input stage includes an isolating circuit for isolating the input stage from a reference ground to minimize a flow of current therethrough.

20. A method of generating a power-up pulse responsive to a supply voltage rising from a reference potential to a steady supply voltage, comprising:

generating a leading edge of the power-up pulse responsive to receipt of the supply voltage;

generating a first signal having a first logic level a delay period after the leading edge of the power-up pulse is generated such that the power-up pulse has a minimum duration of the delay period; and generating a trailing edge of the power-up pulse upon the first signal having the first logic level, the leading edge and the trailing edge sequentially generated defining the power-up pulse.

21. The method according to claim 20, further including the step of:

generating a second signal having one logic level a selected time period after the supply voltage is received; and wherein the trailing edge of the power-up pulse is generated upon the first signal having the first logic level and the second signal having the one logic level.

22. The method according to claim 21, further including the step of preventing the second signal from generating the trailing edge of the power-up pulse during the delay period if a logic level other than the first logic level is present in the first signal.

23. The method according to claim 21 wherein the second signal is generated by an input circuit, and wherein the method further includes the step of disabling at least part of the input circuit responsive to the one logic level thereby reducing the power consumed by the input circuit after the one logic level has been generated.

24. The method according to claim 21 wherein the first logic level and the one logic level are voltages of substantially the same magnitude.

* * * * *